(12) United States Patent
Nakata et al.

(10) Patent No.: US 9,209,846 B2
(45) Date of Patent: Dec. 8, 2015

(54) RADIO COMMUNICATION CIRCUIT AND RADIO COMMUNICATION DEVICE

(71) Applicant: FUJITSU LIMITED, Kawasaki-shi, Kanagawa (JP)

(72) Inventors: Youji Nakata, Sapporo (JP); Setsuya Nagaya, Sapporo (JP); Kosei Nishimura, Sapporo (JP); Masaaki Saitou, Sapporo (JP); Mikio Hayashihara, Kawasaki (JP); Atsushi Kudo, Ishikari (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/473,628

(22) Filed: Aug. 29, 2014

(65) Prior Publication Data
US 2015/0065061 A1 Mar. 5, 2015

(30) Foreign Application Priority Data
Sep. 4, 2013 (JP) ................................. 2013-183455

(51) Int. Cl.
*H04B 1/04* (2006.01)
*H04B 1/10* (2006.01)

(52) U.S. Cl.
CPC ................ *H04B 1/10* (2013.01); *H04B 1/0475* (2013.01); *H04B 2001/0416* (2013.01)

(58) Field of Classification Search
CPC . H04B 1/0475; H04B 1/10; H04B 2001/0416
USPC ............... 455/73, 522, 69, 110, 127.1, 115.1, 455/115.2, 126, 114.3, 102, 67.11; 375/224, 296, 286, 285, 227; 330/149, 330/2
See application file for complete search history.

(56) References Cited

U.S. PATENT DOCUMENTS 6,175,270 B1 * 1/2001 Vannucci ........................... 330/2
6,831,954 B1 * 12/2004 Mandyam ..................... 375/286
(Continued)

FOREIGN PATENT DOCUMENTS

JP  06-037551 A  2/1994
JP  2000-004173 A  1/2000
(Continued)

OTHER PUBLICATIONS

"NTT docomo Technical Journal vol. 18 No. 2", Jul. 28, 2003(Search Date), <URL:http://www.nttdocomoco.jp/corporate/technology/rd/technical_journal/bn/vol18_2/>.

*Primary Examiner* — Tan H Trinh
(74) *Attorney, Agent, or Firm* — Maschoff Brennan

(57) ABSTRACT

A radio communication circuit includes a transmitter that includes a modulator modulates a signal with a first modulation scheme and a power amplifier amplifies the signal modulated with the first modulation scheme and output the amplified signal and transmits the amplified signal, a receiver that includes a demodulator demodulates the signal output from the transmitter with a second modulation scheme that is different from the first modulation scheme, a pre-distortion compensator compensates occurred upon the amplification of the signal, of the signal input to the transmitter, based on the demodulated signal and a power controller controls supply of power to the receiver and the pre-distortion compensator and stop the supply of the power based on an average power level of the signal output from the transmitter and a peak-to-average power ratio that is a ratio of an instantaneous peak power level to the average power level.

7 Claims, 13 Drawing Sheets

(56) References Cited

U.S. PATENT DOCUMENTS

| | | | |
|---|---|---|---|
| 8,195,103 B2* | 6/2012 | Waheed et al. | 455/114.3 |
| 9,020,454 B2* | 4/2015 | Waheed et al. | 455/114.3 |
| 2006/0046764 A1* | 3/2006 | Ohba et al. | 455/522 |
| 2007/0190952 A1* | 8/2007 | Waheed et al. | 455/114.3 |
| 2008/0211576 A1* | 9/2008 | Moffatt et al. | 330/149 |
| 2010/0029225 A1* | 2/2010 | Urushihara et al. | 455/110 |
| 2010/0222015 A1* | 9/2010 | Shimizu et al. | 455/102 |
| 2010/0277236 A1* | 11/2010 | Horiguchi et al. | 330/149 |
| 2012/0263256 A1* | 10/2012 | Waheed et al. | 375/296 |
| 2013/0034139 A1* | 2/2013 | Khlat et al. | 375/224 |
| 2015/0146819 A1* | 5/2015 | Chowdhury et al. | 375/296 |

FOREIGN PATENT DOCUMENTS

| | | |
|---|---|---|
| JP | 2006-067073 A | 3/2006 |
| JP | 2009-055378 A | 3/2009 |
| JP | 2010-041721 A | 2/2010 |

* cited by examiner

| PAPR | COMMUNICATION METHOD | | | | | | | | | | | | | | UNIT |
|---|---|---|---|---|---|---|---|---|---|---|---|---|---|---|---|
| | | | THRESHOLD | | | | | | | | | | | | |
| LARGE | W-CDMA | TRANSMITTER POWER OUTPUT | +17dBm | | | | | | | | | | | | dBm |
| | LTE | RB | 1 | ... | 10 | ... | 50 | ... | FULL | | | | | | |
| | | TRANSMITTER POWER OUTPUT | 22 | ... | 20 | ... | 18 | ... | 16 | | | | | | dBm |
| | LTE-Advanced | CC ALLOCATION | 20MHz | | | | | | | 40MHz | | | | | |
| | | RB | 1 | ... | 10 | ... | 50 | ... | FULL | 1 | ... | 10 | ... | 50 | ... | FULL |
| | | TRANSMITTER POWER OUTPUT | 21 | ... | 19 | ... | 17 | ... | 14 | 19 | ... | 17 | ... | 14 | ... | 11 | dBm |
| | | | 60MHz | | | | | | | | | | | | |
| | | RB | 1 | ... | 10 | ... | 50 | ... | FULL | | | | | | |
| | | TRANSMITTER POWER OUTPUT | 17 | ... | 15 | ... | 13 | ... | 11 | | | | | | dBm |
| MEDIUM | W-CDMA | TRANSMITTER POWER OUTPUT | +17dBm | | | | | | | | | | | | dBm |
| | LTE | RB | 1 | ... | 10 | ... | 50 | ... | FULL | | | | | | |
| | | TRANSMITTER POWER OUTPUT | 23 | ... | 21 | ... | 19 | ... | 17 | | | | | | dBm |
| | LTE-Advanced | CC ALLOCATION | 20MHz | | | | | | | 40MHz | | | | | |
| | | RB | 1 | ... | 10 | ... | 50 | ... | FULL | 1 | ... | 10 | ... | 50 | ... | FULL |
| | | TRANSMITTER POWER OUTPUT | 22 | ... | 20 | ... | 18 | ... | 16 | 20 | ... | 18 | ... | 16 | ... | 12 | dBm |
| | | | 60MHz | | | | | | | | | | | | |
| | | RB | 1 | ... | 10 | ... | 50 | ... | FULL | | | | | | |
| | | TRANSMITTER POWER OUTPUT | 18 | ... | 16 | ... | 14 | ... | 12 | | | | | | dBm |
| SMALL | W-CDMA | TRANSMITTER POWER OUTPUT | +17dBm | | | | | | | | | | | | dBm |
| | LTE | RB | 1 | ... | 10 | ... | 50 | ... | FULL | | | | | | |
| | | TRANSMITTER POWER OUTPUT | 24 | ... | 22 | ... | 20 | ... | 18 | | | | | | dBm |
| | LTE-Advanced | CC ALLOCATION | 20MHz | | | | | | | 40MHz | | | | | |
| | | RB | 1 | ... | 10 | ... | 50 | ... | FULL | 1 | ... | 10 | ... | 50 | ... | FULL |
| | | TRANSMITTER POWER OUTPUT | 23 | ... | 21 | ... | 19 | ... | 17 | 21 | ... | 19 | ... | 17 | ... | 13 | dBm |
| | | | 60MHz | | | | | | | | | | | | |
| | | RB | 1 | ... | 10 | ... | 50 | ... | FULL | | | | | | |
| | | TRANSMITTER POWER OUTPUT | 19 | ... | 17 | ... | 15 | ... | 13 | | | | | | dBm |

RADIO COMMUNICATION CIRCUIT AND RADIO COMMUNICATION DEVICE

CROSS-REFERENCE TO RELATED APPLICATION

This application is based upon and claims the benefit of priority of the prior Japanese Patent Application No. 2013-183455, filed on Sep. 4, 2013, the entire contents of which are incorporated herein by reference.

FIELD

The embodiment discussed herein is related to a radio communication circuit and a radio communication device.

BACKGROUND

Traditionally, there has been a radio communication device that causes a receiving system of a modulation scheme that is different from a signal to feed back the signal to a transmitting system so as to compensate for a distortion of the signal to be transmitted. In addition, there has been a distortion compensating circuit that changes, based on a power level, an operating point of a compensation amplifier for controlling a power level of a distortion occurred in a power amplifier. Those techniques are described in, for example, Japanese Laid-open Patent Publication Nos. 2009-55378 and 6-37551.

SUMMARY

According to an aspect of the invention, a radio communication circuit includes a transmitter that includes a modulator configured to modulate a signal with a first modulation scheme and a power amplifier configured to amplify the signal modulated with the first modulation scheme and output the signal amplified and is configured to transmit the signal amplified by the power amplifier, a receiver that includes a demodulator configured to demodulate the signal output from the transmitter with a second modulation scheme that is different from the first modulation scheme, a pre-distortion compensator configured to compensate for a distortion, occurred upon the amplification of the signal by the power amplifier, of the signal input to the transmitter, based on the signal demodulated by the demodulator, and a power controller configured to control supply of power to the receiver and the pre-distortion compensator and stop the supply of the power based on an average power level of the signal output from the transmitter and a peak-to-average power ratio that is a ratio of an instantaneous peak power level to the average power level.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a diagram illustrating an example of a threshold table included in the baseband unit illustrated in FIG. 11.

DESCRIPTION OF EMBODIMENT

Figure 1:
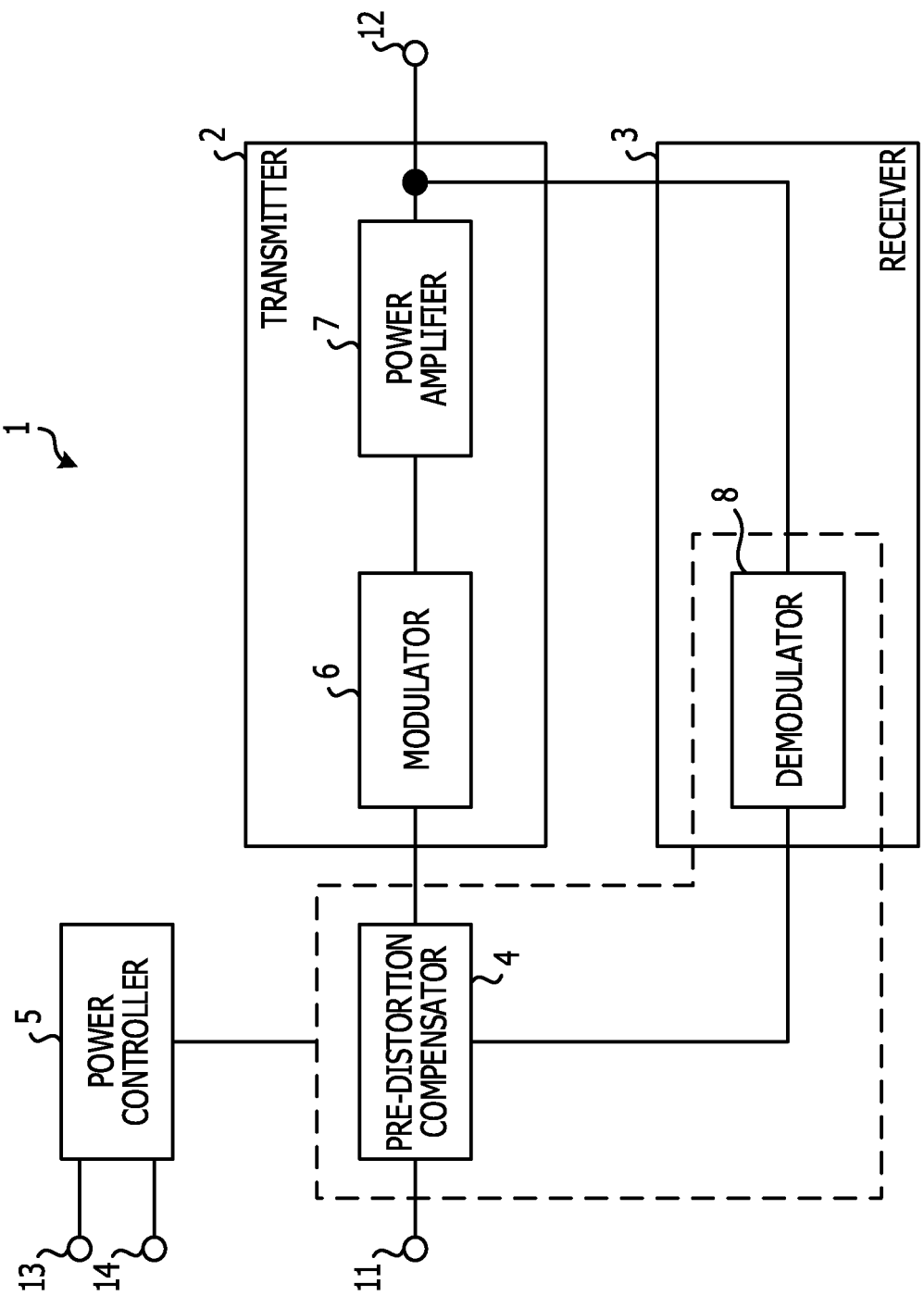
FIG. 1 is a diagram illustrating a first example of a radio communication circuit according to an embodiment.

The conventional technique for compensating for a distortion causes an increase in power to be consumed, since a power source of the receiving system to be used to feed back a signal is normally turned on. In addition, although the amount of a distortion occurred in the power amplifier is affected by instantaneous peak power, the other conventional technique compensates for a distortion based on average power of signals that pass through the power amplifier. Thus, a power source of the circuit for compensating for a distortion is not turned off based on instantaneous peak power. Specifically, the power source of the circuit for compensating for a distortion is normally turned on even when a distortion is not compensated for due to the magnitude of the instantaneous peak power, and thus the amount of power to be consumed increases.

It is an object of the disclosure to provide a radio communication circuit and a radio communication device that reduce the amount of power to be consumed.

An embodiment of the radio communication circuit and the radio communication device is described in detail with reference to the accompanying drawings. In the following examples, the same constituent elements are represented by the same reference numerals, and a duplicated description is omitted.

First Example of Radio Communication Circuit

Figure 2:
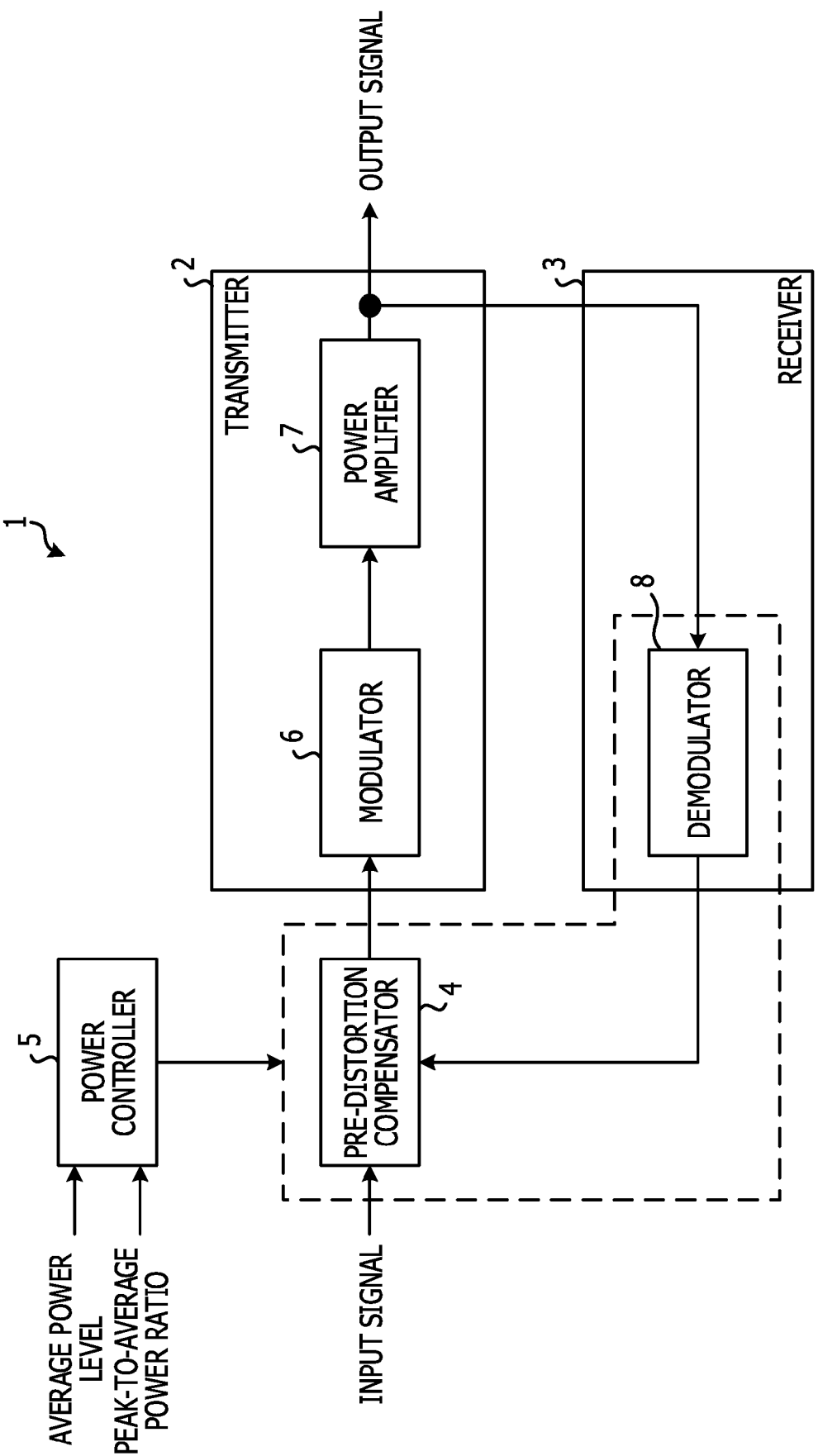
FIG. 2 is a diagram illustrating the flow of a signal in the radio communication circuit illustrated in FIG. 1.

FIG. 1 is a diagram illustrating a first example of the radio communication circuit according to the embodiment. FIG. 2 is a diagram illustrating the flow of a signal in the radio communication circuit illustrated in FIG. 1. As illustrated in FIGS. 1 and 2, the radio communication circuit 1 includes a transmitter 2, a receiver 3, a pre-distortion compensator 4, and a power controller 5. The transmitter 2 includes a modulator 6 and a power amplifier 7 and outputs a signal amplified by the power amplifier 7. The receiver 3 includes a demodulator 8 and receives the signal output from the transmitter 2.

A first input terminal of the pre-distortion compensator 4 is connected to a signal input terminal 11 of the radio communication circuit 1. A second input terminal of the pre-distortion compensator 4 is connected to an output terminal of the demodulator 8. An input terminal of the modulator 6 is connected to an output terminal of the pre-distortion compensator 4. An input terminal of the power amplifier 7 is connected to an output terminal of the modulator 6.

An input terminal of the demodulator 8 is connected to an output terminal of the power amplifier 7. A signal output terminal 12 of the radio communication circuit 1 is connected to the output terminal of the power amplifier 7. A first input terminal of the power controller 5 is connected to an average power level input terminal 13. A second input terminal of the power controller 5 is connected to a peak-to-average power ratio input terminal 14. An output terminal of the power controller 5 is connected to the pre-distortion compensator 4 and the demodulator 8.

The transmitter 2, the modulator 6, the power amplifier 7, the receiver 3, the demodulator 8, the pre-distortion compensator 4, and the power controller 5 may be achieved by hardware. Alternatively, the power controller 5 may be achieved by causing a processor to execute software.

A signal to be transmitted is input to the signal input terminal 11 of the radio communication circuit 1 from an upstream-side signal processor (not illustrated), for example. The signal to be transmitted is input to the pre-distortion compensator 4. The signal to be transmitted may be a baseband signal, for example.

The modulator 6 uses a first modulation scheme to modulate the signal output from the pre-distortion compensator 4 and outputs the modulated high-frequency signal. The high-frequency signal output from the modulator 6 is input to the power amplifier 7.

The power amplifier 7 amplifies the signal output from the modulator 6 and outputs the signal amplified. The signal output from the power amplifier 7 is emitted into air from an antenna (not illustrated) through the signal output terminal 12 of the radio communication circuit 1, for example. In addition, the signal output from the power amplifier 7 is input to the demodulator 8.

The demodulator 8 uses a second modulation scheme to demodulate the high-frequency signal output from the power amplifier 7 and outputs the signal demodulated. The second modulation scheme is different from the first modulation scheme. The signal output from the demodulator 8 is input to the pre-distortion compensator 4. The signal demodulated by the demodulator 8 may be a baseband signal, for example.

The first modulation scheme may be Wideband Code Division Multiple Access (W-CDMA), CDMA2000, Long Term Evolution (LTE), or LTE-Advanced, for example. The second modulation scheme may be Global System for Mobile Communications (GSM) (registered trademark), for example. The first and second modulation schemes may be modulation schemes other than the aforementioned modulation schemes. A combination of the first and second modulation schemes may be a combination of modulation schemes other than the aforementioned modulation schemes.

The pre-distortion compensator 4 compensates for, based on the signal output from the demodulator 8, a distortion, occurred upon the amplification of the signal by the power amplifier 7, of the signal input from the signal input terminal 11 of the radio communication circuit 1 and to be transmitted. For example, the pre-distortion compensator 4 may compensate for the distortion by extracting, as a distorted component, the difference between the signal to be transmitted and the signal output from the demodulator 8 and adding the distorted component to the signal to be transmitted so as to cause the distorted component to have the same amplitude as the signal to be transmitted and cause the phase of the distorted component to be opposite to the phase of the signal to be transmitted.

Information that represents an average power level is input to the average power level input terminal 13. The average power level represents the average power level of the signal output from the transmitter 2. Information that represents a peak-to-average power ratio is input to the peak-to-average power ratio input terminal 14. The peak-to-average power ratio represents the ratio of an instantaneous peak power level to the average power level. Thus, the information that represents the average power level and the information that represents the peak-to-average power ratio are input to the power controller 5. The power controller 5 is configured to control supply of power to the receiver 3 and the pre-distortion compensator 4 based on the average power level and the peak-to-average power ratio and to stop the supply of the power based on the average power level and the peak-to-average power ratio. The power controller 5 may have the information representing the average power level and the information representing the peak-to-average power ratio, instead of the fact that the information that represents the average power level and the information that represents the peak-to-average power ratio are input to the power controller 5.

When the power is supplied to the receiver 3 and the pre-distortion compensator 4 by the power controller 5, the demodulator 8 and the pre-distortion compensator 4 operate. Thus, the signal output from the power amplifier 7 is demodulated by the demodulator 8. Then, the pre-distortion compensator 4 uses the signal demodulated by the demodulator 8 to compensate for the distortion of the signal to be transmitted.

When the supply of the power to the receiver 3 and the pre-distortion compensator 4 is stopped by the power controller 5, the demodulator 8 and the pre-distortion compensator 4 stop operating. In this case, the pre-distortion compensator 4 does not compensate for the distortion of the signal to be transmitted and outputs the input signal to be transmitted without changing the signal.

In the radio communication circuit 1 illustrated in FIG. 1, the supply of the power to the receiver 3 and the pre-distortion compensator 4 is controlled and stopped based on not only the average power level but also the peak-to-average power ratio. If the average power level is high, the peak-to-average power ratio is low, and thus the distortion is not to be compensated for by the pre-distortion compensator 4, operations of the receiver 3 and the pre-distortion compensator 4 may be stopped. Thus, the amount of power to be consumed may be reduced, compared with a case where if the average power level is high, power is supplied to the receiver 3 and the pre-distortion compensator 4 and thereby causes the receiver 3 and the pre-distortion compensator 4 to operate.

Example of Radio Communication Device

Figure 3:
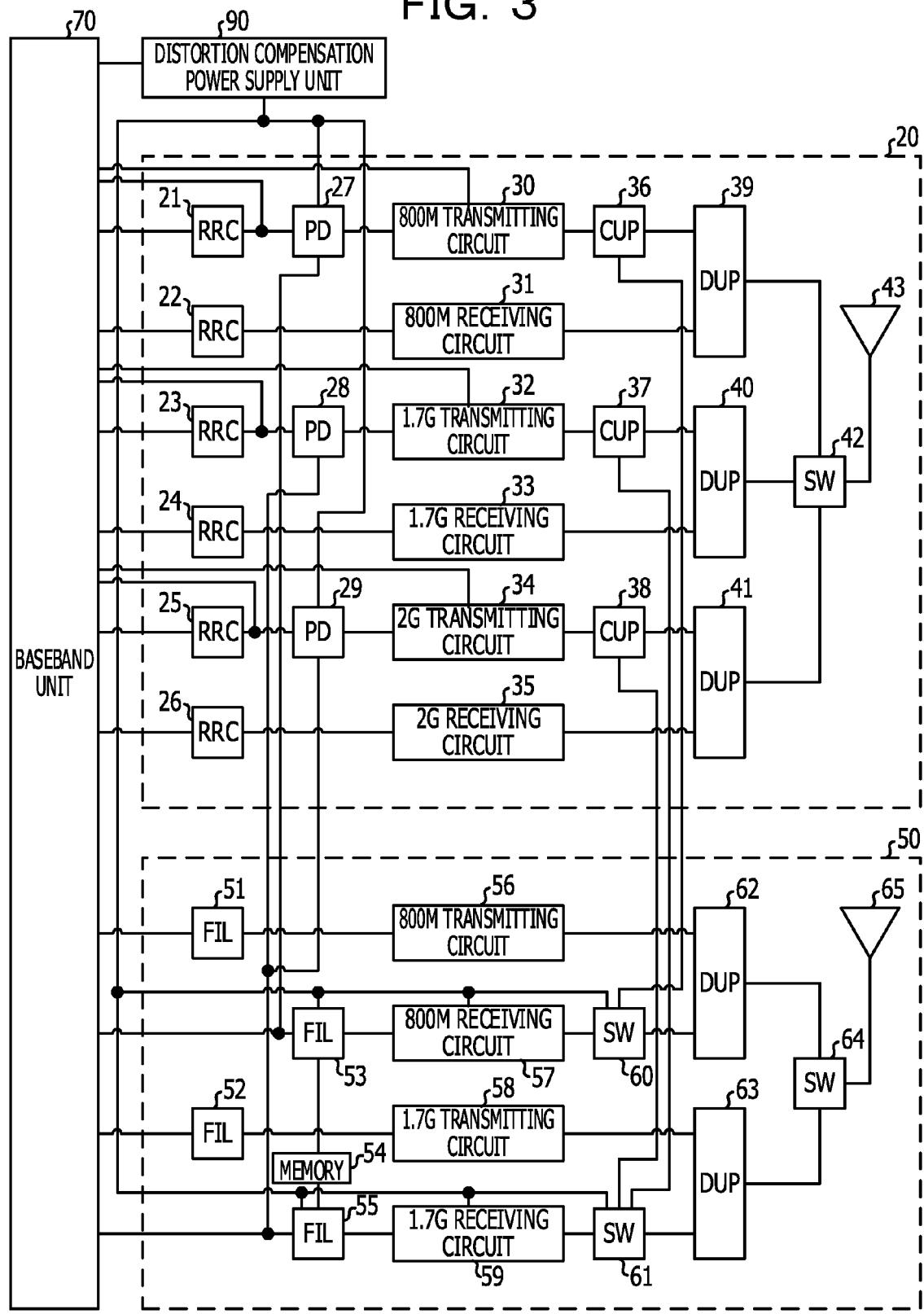
FIG. 3 is a diagram illustrating an example of a radio communication device according to the embodiment.
Figure 4:
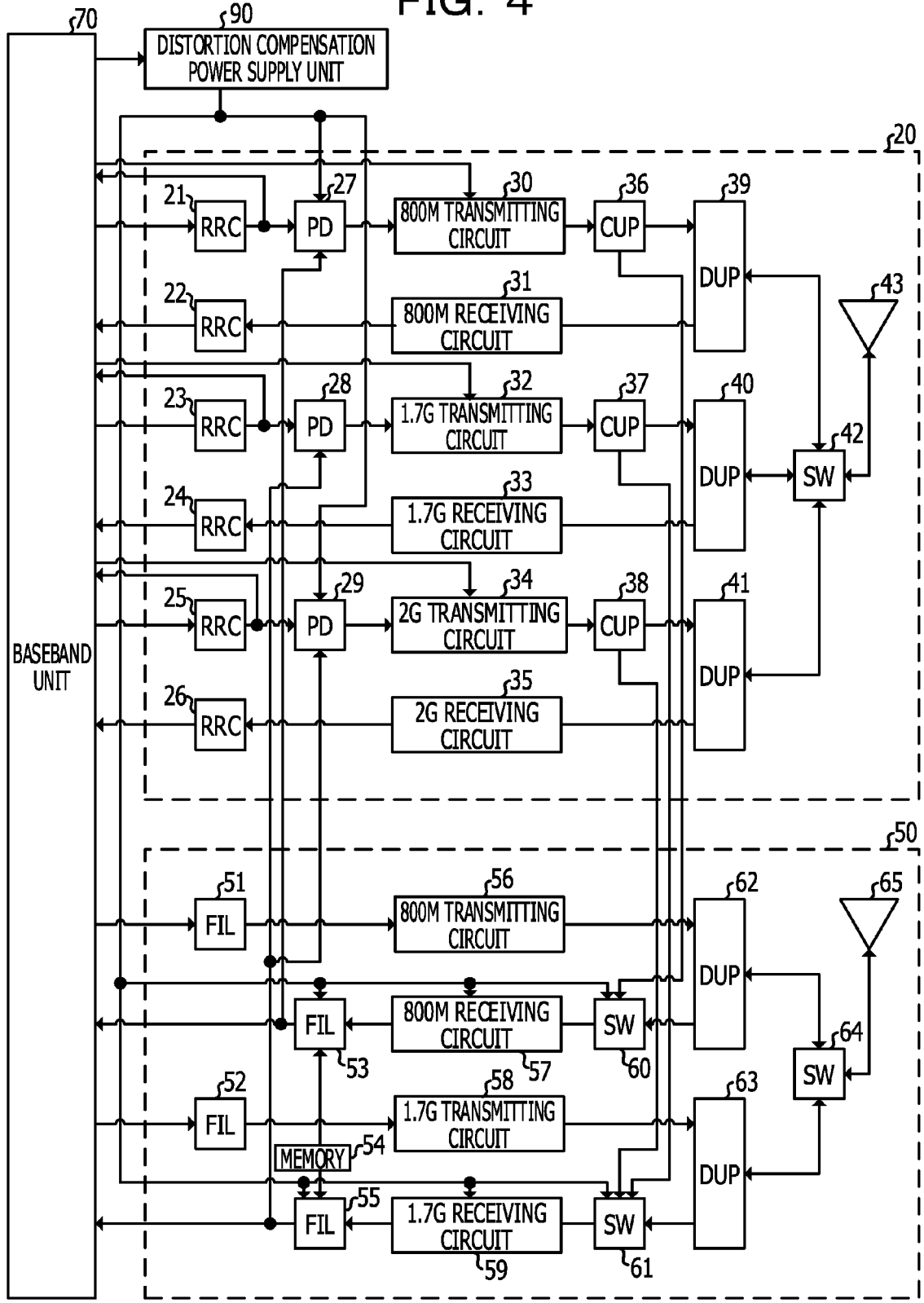
FIG. 4 is a diagram illustrating the flows of signals in the radio communication device illustrated in FIG. 3.

FIG. 3 is a diagram illustrating an example of the radio communication device according to the embodiment. FIG. 4 is a diagram illustrating the flows of signals in the radio communication device illustrated in FIG. 3. As illustrated in FIGS. 3 and 4, the radio communication device supports multiple modes and includes a radio unit 20 of a first modulation scheme and a radio unit 50 of a second modulation scheme, for example. The radio unit 20 transmits or receives a signal using the first modulation scheme, while the radio unit 50 transmits or receives a signal using the second modulation scheme. The radio communication device includes a baseband unit 70 and a distortion compensation power supply unit 90.

Like the first example (described above) of the radio communication circuit, the first modulation scheme may be W-CDMA, CDMA2000, LTE, or LTE-Advanced, and the second modulation scheme may be GSM, for example. The first and second modulation schemes may be modulation schemes other than the aforementioned modulation schemes. A combination of the first and second modulation schemes may be a combination of modulation schemes other than the aforementioned modulation schemes.

The radio communication device supports multiple bands. For example, the radio unit 20 of the first modulation scheme may transmit or receive signals using frequency bands of 800 MHz, 1.7 GHz, and 2 GHz, while the radio unit 50 of the second modulation scheme may transmit or receive signals using frequency bands of 800 MHz and 1.7 GHz. The radio unit 20 of the first modulation scheme and the radio unit 50 of the second modulation scheme may transmit or receive signals using other frequency bands.

In the radio unit 20 of the first modulation scheme, a pre-distortion compensator (PD) 27 that is included in a 800 MHz frequency band signal transmitting system compensates for distortions of I and Q baseband signals to be transmitted, based on signals fed back from a 800 MHz frequency band signal receiving system included in the radio unit 50 of the second modulation scheme. The I and Q baseband signals to be transmitted are output from the baseband unit 70. Then, a Root-Raised Cosine filter (RRC) 21 filters the I and Q baseband signals so as to limit frequency bands of the I and Q baseband signals. After that, the I and Q baseband signals are input to the PD 27. The PD 27 is an example of a pre-distortion compensator.

When the radio communication device executes radio communication by operating the 800 MHz frequency band signal transmitting system and a 800 MHz frequency band signal receiving system in the radio 20 of the first modulation scheme, the 800 MHz frequency band signal receiving system that is included in the radio unit 50 of the second modulation scheme does not execute radio communication. Thus, the 800 MHz frequency band signal receiving system that is included in the radio unit 50 of the second modulation scheme is able to operate as a feedback circuit for feeding back a signal to be transmitted from the 800 MHz frequency band signal transmitting system included in the radio 20 of the first modulation scheme.

For example, the signals output from a 800 M transmitting circuit 30 included in the radio unit 20 of the first modulation scheme are distributed to two paths by the a coupler (CUP) 36. The 800 M transmitting circuit 30 modulates the I and Q baseband signals output from the PD 27 into signals of an 800 MHz frequency band and transmits the signals modulated. The 800 M transmitting circuit 30 is an example of a transmitter.

In one of the two paths, the signals distributed by the CUP 36 are emitted into air from an antenna 43 through a duplexer (DUP) 39 and a switch (SW) 42. In the other path, the signals distributed by the CUP 36 pass through the SW 60, an 800 M receiving circuit 57, and a waveform shaping filter (FIL) 53 in the 800 MHz frequency band signal receiving system included in the radio unit 50 of the second modulation scheme and is fed back to the PD 27 included in the 800 MHz frequency band signal transmitting system included in the radio unit 20 of the first modulation scheme. The 800 M receiving circuit 57 demodulates the signals of the 800 MHz frequency band into I and Q baseband signals. The 800 M receiving circuit 57 is an example of a receiver.

In a case where the 800 MHz frequency band signal transmitting system that is included in the radio unit 20 of the first modulation scheme transmits a signal, the 800 MHz frequency band signal receiving system that is included in the radio unit 50 of the second modulation scheme operates as a feedback circuit for compensating for a distortion. In this case, the distortion compensation power supply unit 90 controls supply of power to the PD 27, the SW 60, the 800 M receiving circuit 57, and the waveform shaping FIL 53 and stops the supply of the power. The PD 27 is included in the 800 MHz frequency band signal transmitting system included in the radio unit 20 of the first modulation scheme, while the SW 60, the 800 M receiving circuit 57, and the waveform shaping FIL 53 are included in the 800 MHz frequency band signal receiving system included in the radio unit 50 of the second modulation scheme.

In the radio unit 20 of the first modulation scheme, a PD 28 that is included in a 1.7 GHz frequency band signal transmitting system compensates for, based on signals fed back from a 1.7 GHz frequency band signal receiving system included in the radio unit 50 of the second modulation scheme, distortions of I and Q baseband signals to be transmitted. The I and Q baseband signals to be transmitted are output from the baseband unit 70. An RRC 23 filters the I and Q baseband signals so as to limit frequency bands of the I and Q baseband signals. After that, the I and Q baseband signals are input to the PD 28. The PD 28 is an example of the pre-distortion compensator.

For example, the signals output from a 1.7 G transmitting circuit 32 included in the radio unit 20 of the first modulation scheme are distributed to two paths by a CUP 37. The 1.7 GHz signal transmitting circuit 32 modulates the I and Q baseband signals output from the PD 28 into signals of a 1.7 GHz frequency band and transmits the signals modulated. The 1.7 G transmitting circuit 32 is an example of the transmitter.

In one of the two paths, the signals distributed by the CUP 37 are emitted into air from the antenna 43 through a DUP 40 and the SW 42. In the other path, the other signals distributed by the CUP 37 pass through an SW 61, a 1.7 G receiving circuit 59, and a waveform shaping FIL 55 in the 1.7 GHz frequency band signal receiving system included in the radio unit 50 of the second modulation scheme and is fed back to the PD 28 included in the 1.7 GHz frequency band signal transmitting system included in the radio unit 20 of the first modulation scheme. The 1.7 G receiving circuit 59 demodulates the signals of the 1.7 GHz frequency band into I and Q baseband signals. The 1.7 G receiving circuit 59 is an example of the receiver.

In a case where the 1.7 GHz frequency band signal transmitting system that is included in the radio unit 20 of the first modulation scheme transmits a signal, the 1.7 frequency band signal receiving system that is included in the radio unit 50 of the second modulation scheme operates as a feedback circuit for compensating for a distortion. In this case, the distortion compensation power supply unit 90 controls supply of power to the PD 28, the SW 61, the 1.7 G receiving circuit 59, and the waveform shaping FIL 55 and stops the supply of the power. The PD 28 is included in the 1.7 frequency band signal transmitting system included in the radio unit 20 of the first modulation scheme, while the SW 61, the 1.7 G receiving circuit 59, and the waveform shaping FIL 55 are included in the 1.7 frequency band signal receiving system included in the radio unit 50 of the second modulation scheme.

In the radio unit 20 of the first modulation scheme, a PD 29 that is included in a 2 GHz frequency band signal transmitting system compensates for, based on signals fed back from the 1.7 GHz frequency band signal receiving system included in the radio unit 50 of the second modulation scheme, distortions of I and Q baseband signals to be transmitted. The I and Q baseband signals to be transmitted are output from the baseband unit 70. An RRC 25 filters the I and Q baseband signals so as to limit frequency bands of the I and Q baseband signals. After that, the I and Q baseband signals are input to the PD 29. The PD 29 is an example of the pre-distortion compensator.

For example, the signals output from a 2 G transmitting circuit 34 included in the radio unit 20 of the first modulation scheme are distributed to two paths by a CUP 38. The 2 G transmitting circuit 34 modulates the I and Q baseband signals output from the PD 29 into signals of the 2 GHz frequency band and transmits the signals modulated. The 2 G transmitting circuit 34 is an example of the transmitter.

In one of the two paths, the signals distributed by the CUP 38 are emitted into air from the antenna 43 through a DUP 41 and the SW 42. In the other path, the signals distributed by the CUP 38 pass through the SW 61, the 1.7 G receiving circuit 59, and the waveform shaping FIL 55 in the 1.7 GHz frequency band signal receiving system included in the radio unit 50 of the second modulation scheme and is fed back to the PD 29 included in the 2 GHz frequency band signal transmitting system included in the radio unit 20 of the first modulation scheme. Since the frequency band of the 1.7 GHz frequency band signal receiving system overlaps the frequency band of the 2 GHz frequency band signal transmitting system, the 1.7 GHz frequency band signal receiving system that is included in the radio unit 50 of the second modulation scheme may process a signal output from the radio unit 20 of the first modulation scheme and to be transmitted at the frequency of 2 GHz.

In a case where the 2 GHz frequency band signal transmitting system that is included in the radio unit 20 of the first modulation scheme transmits a signal, the 1.7 GHz frequency band signal receiving system that is included in the radio unit 50 of the second modulation scheme operates as the feedback circuit for compensating for a distortion. In this case, the distortion compensation power supply unit 90 controls supply of power to the PD 29, the SW 61, the 1.7 G receiving circuit 59, and the waveform shaping FIL 55 and stops the supply of the power. The PD 29 is included in the 2 GHz frequency band signal transmitting system included in the radio unit 20 of the first modulation scheme, while the SW 61, the 1.7 G receiving circuit 59, and the waveform shaping FIL 55 are included in the 1.7 GHz frequency band signal receiving system included in the radio unit 50 of the second modulation scheme.

The distortion compensation power supply unit 90 controls the supply of power to the PDs 27 to 29, the SWs 60 and 61, the 800 M receiving circuit 57, the 1.7 G receiving circuit 59, and the waveform shaping FILs 53 and 55 and stops the supply of the power. The control of the supply is described later. Signals involved in the control of the supply of power by the distortion compensation power supply unit 90 or signals involved in the stop of the supply of power by the distortion compensation power supply unit 90 are input to the baseband unit 70 from the RRCs 21, 23, and 25 included in the 800 M, 1.7 G, and 2 G signal transmitting systems of the radio unit 20 of the first modulation scheme and are described later. In addition, signals that control gains to be used for the signal amplification by the 800 M, 1.7 G, and 2 G transmitting circuits 30, 32, and 34 are input from the baseband unit 70 to the 800 M, 1.7 G, and 2 G transmitting circuits 30, 32, and 34 included in the radio unit 20 of the first modulation scheme and are described later.

When the radio communication device operates the 800 MHz frequency band signal receiving system in the radio unit 20 of the first modulation scheme and cause the 800 MHz frequency band signal receiving system to receive a radio signal, the signal received by the antenna 43 passes through the SW 42 and the DUP 39 and is demodulated by the 800 M receiving circuit 31 into I and Q baseband signals. The RRC 22 filters the I and Q baseband signals demodulated by the 800 M receiving circuit 31 so as to limit frequency bands of the I and Q baseband signals. After that, the I and Q baseband signals are input to the baseband unit 70.

When the radio communication device operates the 1.7 GHz frequency band signal receiving system in the radio unit 20 of the first modulation scheme and cause the 1.7 GHz frequency band signal receiving system to receive a radio signal, the signal received by the antenna 43 passes through the SW 42 and the DUP 40 and is demodulated by the 1.7 G receiving circuit 33 into I and Q baseband signals. The RRC 24 filters the I and Q baseband signals demodulated by the 1.7 G receiving circuit 33 so as to limit frequency bands of the I and Q baseband signals. After that, the I and Q baseband signals are input to the baseband unit 70.

When the radio communication device operates the 2 GHz frequency band signal receiving system in the radio unit 20 of the first modulation scheme and cause the 2 GHz frequency band signal receiving system to receive a radio signal, the signal received by the antenna 43 passes through the SW 42 and the DUP 41 and is demodulated by the 2 G receiving circuit 35 into I and Q baseband signals. The RRC 26 filters the I and Q baseband signals demodulated by the 2 G receiving circuit 35 so as to limit frequency bands of the I and Q baseband signals. After that, the I and Q baseband signals are input to the baseband unit 70.

In a case where the radio communication device operates the 800 MHz frequency band signal transmitting system in the radio unit 50 of the second modulation scheme so as to cause the 800 MHz frequency band signal transmitting system to transmit radio signals, I and Q baseband signals output from the baseband signal 70 and to be transmitted pass through the FIL 51 and are modulated by the 800 M transmitting circuit 56. The signals output from the 800 M transmitting circuit 56 are emitted into air from an antenna 65 through a DUP 62 and an SW 64.

When the radio communication device operates the 800 MHz frequency band signal receiving system in the radio unit 50 of the second modulation scheme and causes the 800 MHz frequency band signal receiving system to receive a radio signal, the signal received by the antenna 65 passes through the SW 64, the DUP 62, and the SW 60 and is demodulated by the 800 M receiving circuit 57 into I and Q baseband signals. The I and Q baseband signals demodulated by the 800 M receiving circuit 57 pass through the waveform shaping FIL 53 and are input to the baseband unit 70.

In a case where the radio communication device operates the 1.7 GHz frequency band signal transmitting system in the radio unit 50 of the second modulation scheme so as to cause the 1.7 GHz frequency band signal transmitting system to transmit radio signals, I and Q baseband signals output from the baseband unit 70 and to be transmitted pass through the FIL 52 and are modulated by the 1.7 G transmitting circuit 58. The signals output from the 1.7 G transmitting circuit 58 are emitted into air from the antenna 65 through the DUP 63 and the SW 64.

When the radio communication device operates the 1.7 GHz frequency band signal receiving system in the radio unit 50 of the second modulation scheme and causes the 1.7 GHz frequency band signal receiving system to receive a radio signal, the signal received by the antenna 65 passes through the SW 64, the DUP 63, and the SW 61 and is demodulated by the 1.7 G receiving circuit 59 into I and Q baseband signals. The I and Q baseband signals demodulated by the 1.7 receiving circuit 59 pass through the waveform shaping FIL 55 and are input to the baseband unit 70. The waveform shaping FILs 53 and 55 are connected to a memory 54. The memory 54 is described later.

A distortion compensation function of the radio communication device illustrated in FIG. 3 is described with reference to FIGS. 5 to 13. The example describes a case where the 800 MHz frequency band signal transmitting system included in the radio unit 20 of the first modulation scheme is configured to transmit a signal and the 800 MHz frequency band signal receiving system included in the radio unit 50 of the second modulation scheme operates as the feedback circuit for compensating for a distortion in the radio communication device illustrated in FIG. 3.

The same applies to two combinations, a combination of the 1.7 GHz frequency band signal transmitting system included in the radio unit 20 of the first modulation scheme and the 1.7 GHz frequency band signal receiving system included in the radio unit 50 of the second modulation scheme and a combination of the 2 GHz frequency band signal transmitting system included in the radio unit 20 of the first modulation scheme and the 1.7 GHz frequency band signal receiving system included in the radio unit 50 of the second modulation scheme. Thus, in the following description of a combination of the 800 MHz frequency band signal transmitting system included in the radio unit 20 of the first modulation scheme and the 800 MHz frequency band signal receiving system included in the radio unit 50 of the second modulation scheme, reference numerals may be interpreted as corresponding reference numerals related to the two combinations, and a description of the two combinations is omitted.

Second Embodiment of Radio Communication Circuit

Figure 5:
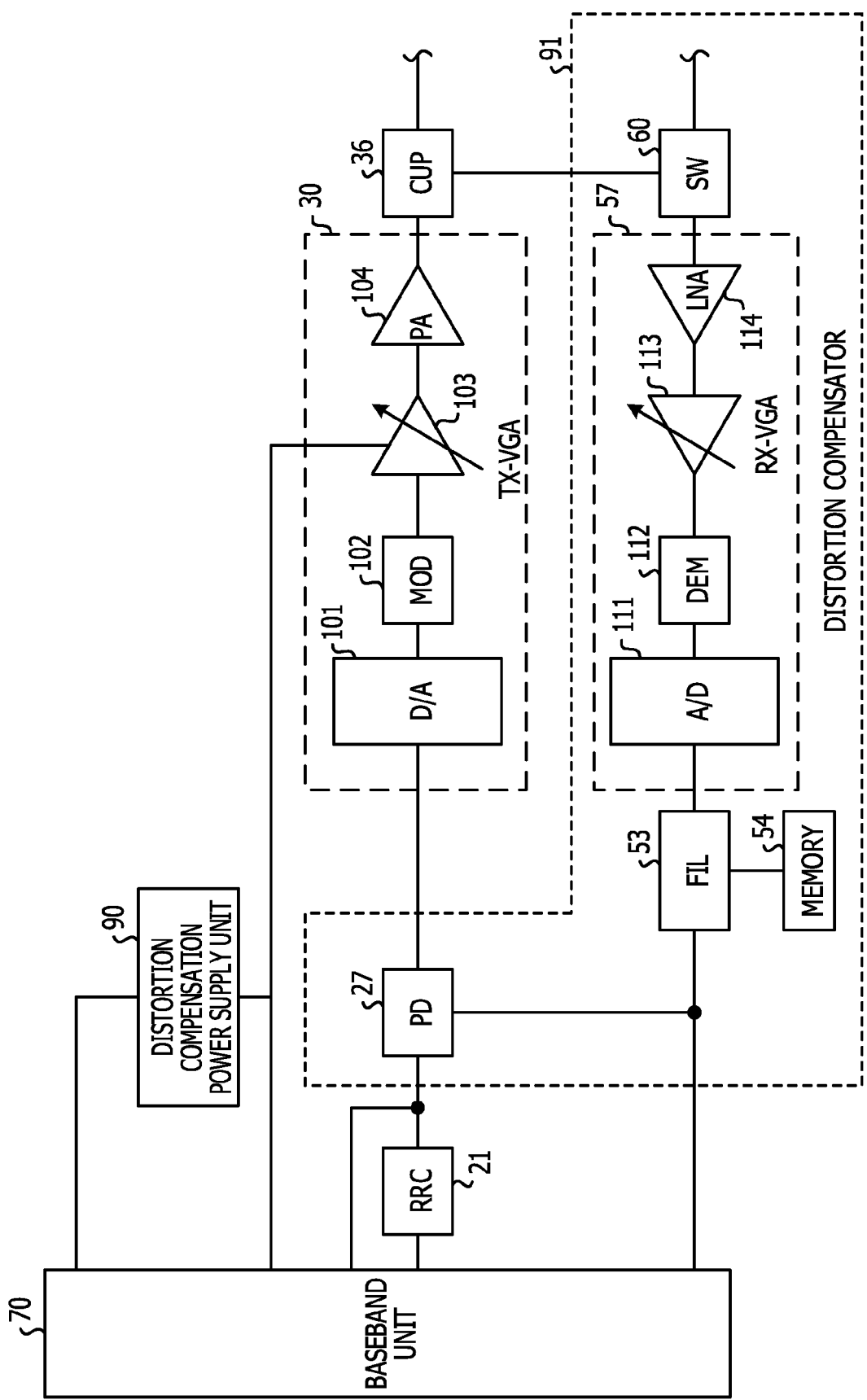
FIG. 5 is a diagram illustrating a second example of the radio communication circuit that achieves a distortion compensation function of the radio communication device illustrated in FIG. 3.
Figure 6:
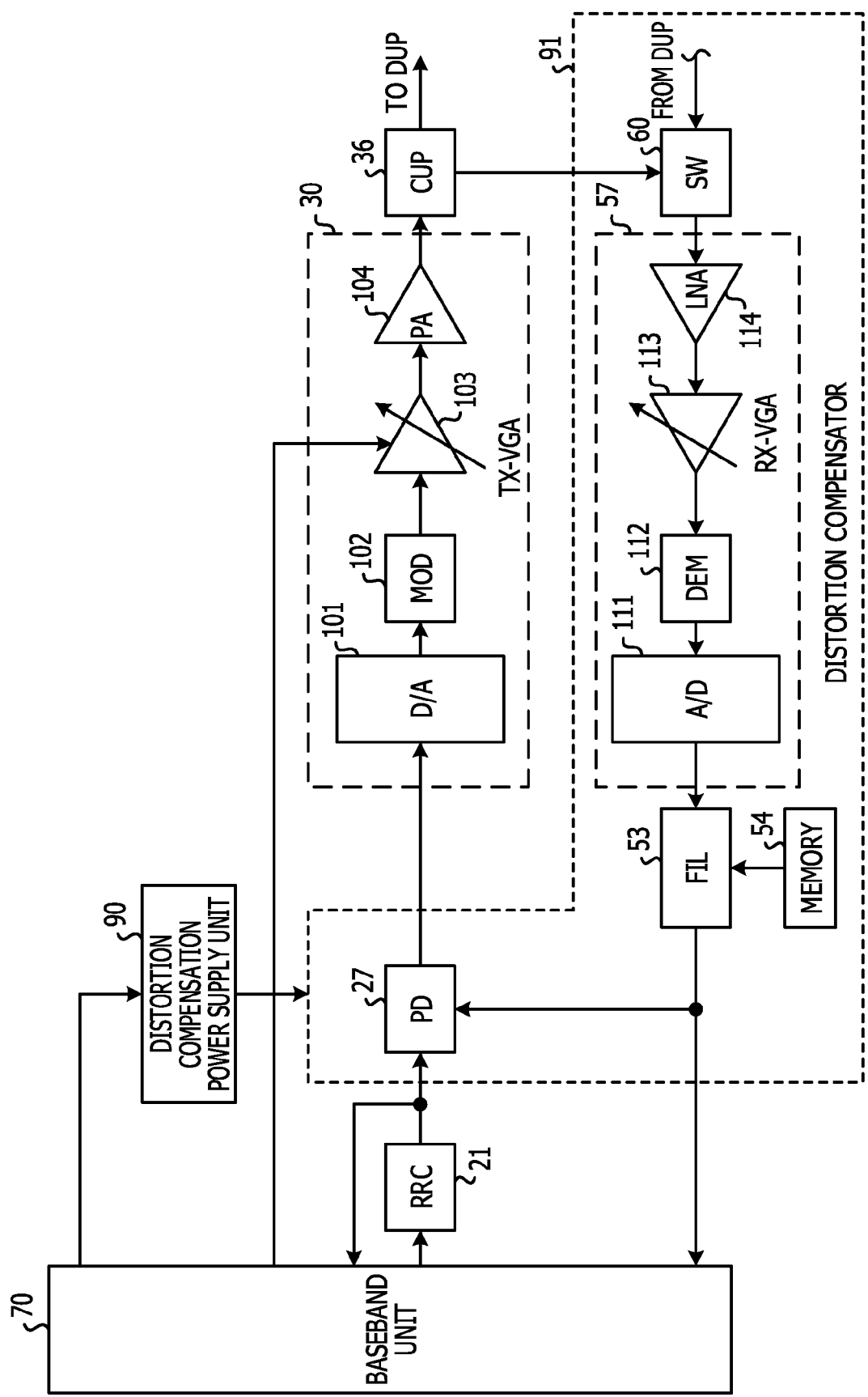
FIG. 6 is a diagram illustrating the flows of signals in the radio communication circuit illustrated in FIG. 5.

FIG. 5 is a diagram illustrating a second example of the radio communication circuit that achieves the distortion compensation function of the radio communication device illustrated in FIG. 3. FIG. 6 is a diagram illustrating the flows of signals in the radio communication circuit illustrated in FIG. 5.

As illustrated in FIGS. 5 and 6, in the 800 MHz frequency band signal transmitting system included in the radio unit 20 of the first modulation scheme, the 800 M transmitting circuit 30 includes a digital-to-analog converter (D/A) 101 and a modulator (MOD) 102. In addition, the 800 M transmitting circuit 30 includes a TX-variable gain amplifier (TX-VGA) 103 and a power amplifier (PA) 104.

An input terminal of the D/A 101 is connected to an output terminal of the PD 27. I and Q baseband signals output from the PD 27 are digital signals. The D/A 101 converts the I and Q baseband signals output from the PD 27 into analog signals.

An input terminal of the MOD 102 is connected to an output terminal of the D/A 101. The MOD 102 modulates the signals output from the D/A 101 into signals to be transmitted at the frequency band of 800 MHz. The MOD 102 is an example of the modulator.

An input terminal of the TX-VGA 103 is connected to an output terminal of the MOD 102. A control terminal of the TX-VGA 103 is connected to the baseband unit 70. The TX-VGA 103 changes a gain based on a control signal output from the baseband unit 70 and amplifies the signals output from the MOD 102, for example. Thus, power levels of the signals to be transmitted are adjusted to values requested by a base station, for example. The TX-VGA 103 is an example of a variable gain amplifier.

An input terminal of the PA 104 is connected to an output terminal of the TX-VGA 103. The PA 104 amplifies the signals output from the TX-VGA 103. The PA 104 is an example of a power amplifier. The signals output from the PA 104 are distributed to the two paths by the CUP 36. The signals distributed by the CUP 36 are transmitted to the DUP 39 included in the radio unit 20 of the first modulation scheme and the SW 60 included in the radio unit 50 of the second modulation scheme.

In the radio unit 20 of the first modulation scheme, the 1.7 G transmitting circuit 32 and the 2 G transmitting circuit 34 have the same configuration as the 800 M transmitting circuit 30.

In the 800 MHz frequency band signal receiving system included in the radio unit 50 of the second modulation scheme, the 800 M receiving circuit 57 includes a low noise amplifier (LNA) 114 and an RX-variable gain amplifier (RX-VGA) 113. In addition, the 800 M receiving circuit 57 includes a demodulator (DEM) 112 and an analog-to-digital converter (A/D) 111.

The SW 60 is connected to the CUP 36 included in the radio unit 20 of the first modulation scheme and the DUP 62 included in the radio unit 50 of the second modulation scheme. When the 800 MHz frequency band signal receiving system that is included in the radio unit 50 of the second modulation scheme operates as the feedback circuit for compensating for a distortion, the SW 60 transfers the signal output from the CUP 36 to the 800 M receiving circuit 57. When the radio communication device operates the 800 MHz frequency band signal receiving system in the radio unit 50 of the second modulation scheme to cause the 800 MHz frequency band signal receiving system to receive a radio signal, the SW 60 transfers the signal output from the DUP 62 to the 800 M receiving circuit 57.

An input terminal of the LNA 114 is connected to an output terminal of the SW 60. The LNA 114 is an amplifier that has a low noise factor and is configured to amplify a signal output from the SW 60.

An input terminal of the RX-VGA 113 is connected to an output terminal of the LNA 114. The RX-VGA 113 changes a gain based on a control signal output from a reception gain controller (not illustrated) and amplifies the signal output from the LNA 114, for example. Thus, a signal level is adjusted to be in an optimal range included in a dynamic range of signal processing of the units arranged on the downstream side of the DEM 112.

An input terminal of the DEM 112 is connected to an output terminal of the RX-VGA 113. The DEM 112 demodulates the 800 MHz frequency band signal output from the RX-VGA 113 into I and Q baseband signals. The DEM 112 is an example of a demodulator.

An input terminal of the A/D 111 is connected to an output terminal of the DEM 112. The I and Q baseband signals output from the DEM 112 are analog signals. The A/D 111 converts the I and Q baseband signals output from the DEM 112 into digital signals. The signals output from the A/D 111 are transferred to the waveform shaping FIL 53.

The memory 54 stores frequency band data of signals to be transmitted by the plurality of transmitting systems and frequency band data of signals received by the plurality of receiving systems. For example, the memory 54 stores frequency band data of signals to be transmitted at the frequency bands of 800 MHz, 1.7 GHz, and 2 GHz from the radio unit 20 of the first modulation scheme and frequency band data of signals received at the frequency bands of 800 MHz and 1.7 GHz by the antenna 65 included in the radio unit 50 of the second modulation scheme.

The memory 54 is a nonvolatile memory such as a read only memory (ROM), an electrically erasable and programmable ROM (EEPROM), or a flash memory. The memory 54 may be arranged outside the radio unit 50 of the second modulation scheme.

An input terminal of the waveform shaping FIL 53 is connected to an output terminal of the A/D 111. The waveform shaping FIL 53 determines whether a signal output from the A/D 111 is a signal distributed by the CUP 36 or a signal received by the antenna 65. Information that represents a signal to be transmitted from the radio unit 20 of the first modulation scheme or a signal received by the radio unit 50 of the second modulation scheme is provided from a controller (not illustrated) to the waveform shaping FIL 53. The waveform shaping FIL 53 determines, based on the information provided from the controller (not illustrated), whether the signal output from the A/D 111 is the signal distributed by the CUP 36 or the signal received by the antenna 65.

If the waveform shaping FIL 53 determines that the signal output from the A/D 111 is the signal distributed by the CUP 36, the waveform shaping FIL 53 reads, from the memory 54, data that does not limit a frequency band and is among frequency band data of 800 MHz frequency band signals to be transmitted from the radio unit 20 of the first modulation scheme. Then, the waveform shaping FIL 53 does not limit a frequency band of the signal output from the A/D 111 and feeds back the signal to the PD 27.

If the waveform shaping FIL 53 determines that the signal output from the A/D 111 is the signal received by the antenna 65, the waveform shaping FIL 53 reads, from the memory 54, frequency band data of the radio unit 50 of the second modulation scheme, limits the frequency band of the signal output from the A/D 111, and transfers the signal to the baseband unit 70.

In the radio unit 50 of the second modulation scheme, the 1.7 G receiving circuit 59 has the same configuration as the 800 M receiving circuit 57.

The distortion compensation power supply unit 90 turns on and off a power source of a distortion compensator 91 that includes the PD 27, the waveform shaping FIL 53, the memory 54, the A/D 111, the DEM 112, the RX-VGA 113, the LNA 114, and the SW 60. Specifically, if the PD 27 compensates for a distortion, the power source of the distortion compensator 91 is turned on by the distortion compensation power supply unit 90. Thus, signals output from the PA 104 are fed back to the PD 27 through the signal receiving system included in the radio unit 50 of the second modulation scheme. On the other hand, if the PD 27 does not compensate for a distortion, the power source of the distortion compensator 91 is turned off by the distortion compensation power supply unit 90. If the power source is in an OFF state, the PD 27 transfers signals output from the RRC 21 to the D/A 101 without executing the distortion compensation on the signals.

Figure 7:
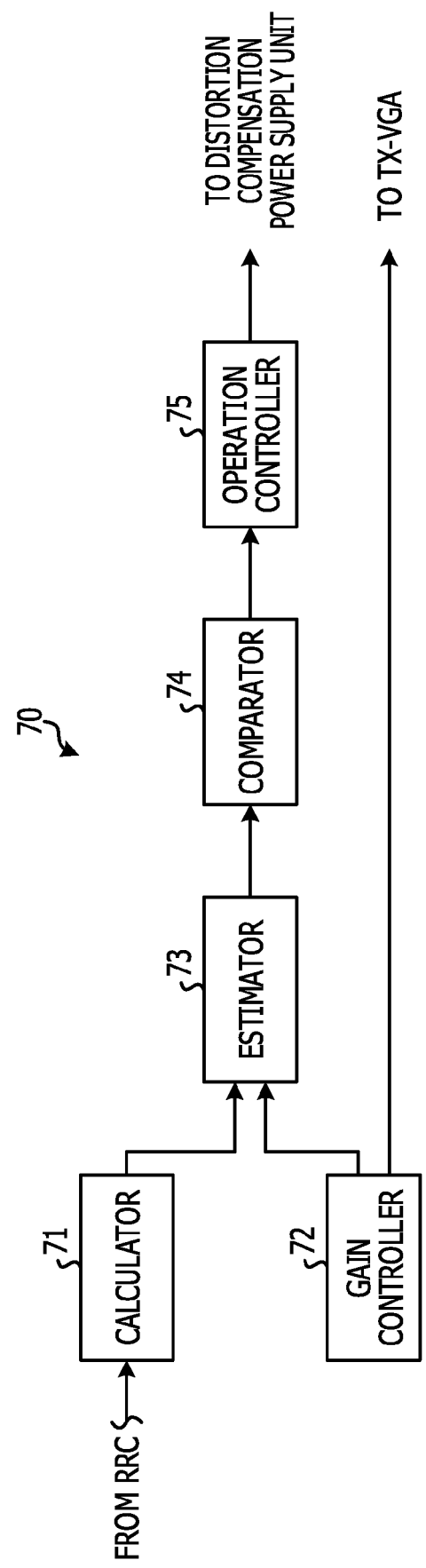
FIG. 7 is a diagram illustrating functional units achieved by a baseband unit included in the radio communication circuit illustrated in FIG. 5.

FIG. 7 is a diagram illustrating functional units achieved by the baseband unit included in the radio communication circuit illustrated in FIG. 5. As illustrated in FIG. 7, the functional units, a calculator 71, a gain controller 72, an estimator 73, a comparator 74, and an operation controller 75, are achieved by the baseband unit 70. The functional units 71 to 75 may be achieved by hardware or by causing a processor to execute software.

I and Q baseband signals output from the RRC 21 are input to the calculator 71. The calculator 71 calculates a peak-to-average power ratio based on the I and Q baseband signals output from the RRC 21. The calculator 71 may calculate the peak-to-average power ratio using a known method, for example.

The gain controller 72 outputs, to the TX-VGA 103, a control signal that controls the gain of the TX-VGA 103. The gain of the TX-VGA 103 is controlled by the control signal. The gain controller 72 monitors power levels of the signals to be transmitted and controls the gain of the TX-VGA 103 based on the power levels monitored. The gain controller 72 may obtain an average power level from information that controls the gain of the TX-VGA 103.

Information that represents the peak-to-average power ratio calculated by the calculator 71, and information that represents the average power level and is included in the gain controller 72, are provided to the estimator 73. The estimator 72 combines the information of the peak-to-average power ratio with the information of the average power level and estimates the instantaneous amplitude of the signals output from the PA 104. The estimator 73 may calculate the instantaneous amplitude using a known method, for example.

The instantaneous amplitude estimated by the estimator 73 is provided to the comparator 74. A threshold that represents a standard instantaneous amplitude is set in the comparator 74 in advance. The comparator 74 compares the instantaneous amplitude provided from the estimator 73 with the threshold. Specifically, if the instantaneous amplitude is equal to or larger than the threshold, the comparator 74 may return "true". If the instantaneous amplitude is smaller than the threshold, the comparator 74 may return "false".

The result of the comparison of the instantaneous amplitude with the threshold is provided from the comparator 74 to the operation controller 75. The operation controller 75 outputs, to the distortion compensation power supply unit 90 based on the comparison result provided from the comparator 74, a control signal that causes the power source of the distortion compensator 91 to be turned on or off.

Specifically, when receiving "true" from the comparator 74, the operation controller 75 outputs, to the distortion compensation power supply unit 90, a control signal that causes the power source of the distortion compensator 91 to be turned on. Thus, the distortion compensation power supply unit 90 controls the power source of the distortion compensator 91 and thereby turns on the power source of the distortion compensator 91. On the other hand, when receiving "false" from the comparator 74, the operation controller 75 outputs, to the distortion compensation power supply unit 90, a control signal that causes the power source of the distortion compensator 91 to be turned off. Thus, the distortion compensation power supply unit 90 controls the power source of the distortion compensator 91 and thereby turns off the power source of the distortion compensator 91.

The calculator 71, the gain controller 72, the estimator 73, the comparator 74, the operation controller 75, and the distortion compensation power supply unit 90 are an example of a power controller. The distortion compensation power supply unit 90 may be one of functional units achieved by the baseband unit 70.

The reception gain controller (not illustrated) that is configured to control an automatic gain control function of the 800 M receiving circuit 57 may monitor the average power level. In addition, the reception gain controller may divide the signals output from the PA 104 and monitor the average power level based on a voltage detected by diode detection. Thus, the estimator 73 may acquire information of the average power level from the reception gain controller or obtain the information of the average power level from the average power level monitored based on the voltage detected by the diode detection.

Figure 8:
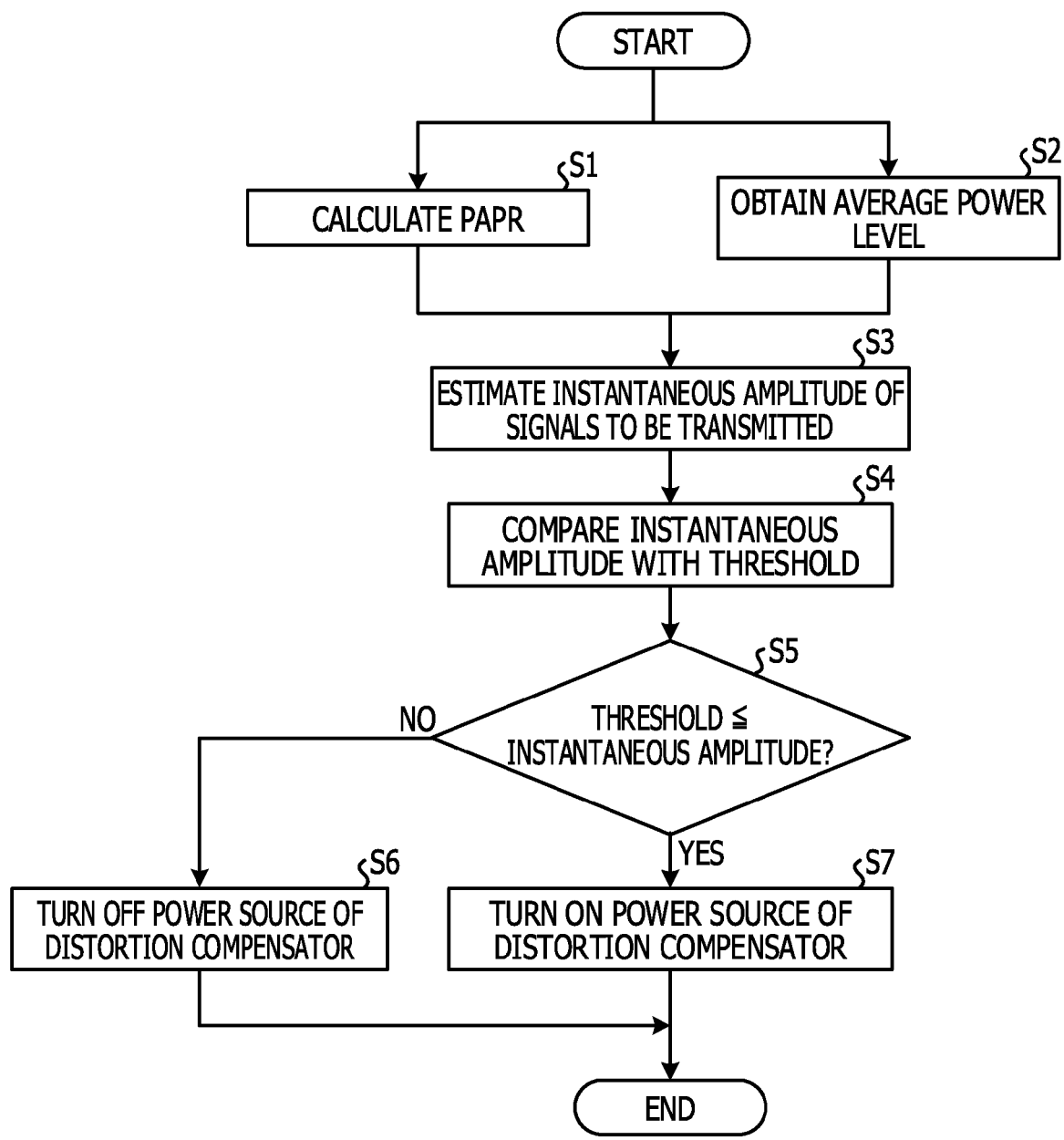
FIG. 8 is a flowchart of operations to be executed by the radio communication circuit illustrated in FIGS. 5 to 7.

FIG. 8 is a flowchart of operations to be executed by the radio communication circuit illustrated in FIGS. 5 to 7. As illustrated in FIG. 8, when the radio communication circuit starts an operation of transmitting a signal, the calculator 71 calculates the peak-to-average power ratio (PAPR) (in step S1). In addition, the gain controller 72 monitors a power level of the signal to be transmitted and obtains the average power level (in step S2). The operations of step S1 and S2 may be executed in parallel by the calculator 71 and the gain controller 72.

Next, the estimator 73 combines information of the peak-to-average power ratio calculated in step S1 with information of the average power level obtained in step S2 and estimates the instantaneous amplitude of the signals output from the PA 104 and to be transmitted (in step S3). Then, the comparator 74 compares the instantaneous amplitude calculated in step S3 with the threshold (in step S4).

If the instantaneous amplitude is smaller than the threshold (No in step S5), the operation controller 75 outputs, to the distortion compensation power supply unit 90, the control signal that causes the power source of the distortion compensator 91 to be turned off. Then, the distortion compensation power supply unit 90 controls the power source of the distortion compensator 91 and thereby turns off the power source of the distortion compensator 91. Thus, the power source of the distortion compensator 91 is turned off (in step S6).

On the other hand, if the instantaneous amplitude is equal to or larger than the threshold (Yes in step S5), the operation controller 75 outputs, to the distortion compensation power supply unit 90, the control signal that causes the power source of the distortion compensator 91 to be turned on. Then, the distortion compensation power supply unit 90 controls the power source of the distortion compensator 91 and thereby turns on the power source of the distortion compensator 91. Thus, the power source of the distortion compensator 91 is turned on (in step S7).

During the transmission of a signal by the radio communication circuit, the radio communication circuit repeats the aforementioned steps S1 to S7. When the signal transmission is terminated, the radio communication circuit terminates a series of the operations.

The radio communication circuit illustrated in FIGS. 5 and 7 or the radio communication device illustrated in FIG. 3 uses not only the average power level but also the peak-to-average power ratio to control the supply of power to the distortion compensator 91 and stop the supply of the power. Thus, if the average power level is high and the peak-to-average power ratio is large, the radio communication circuit illustrated in FIGS. 5 to 7 or the radio communication device illustrated in FIG. 3 may compensate for a distortion by supplying power to the distortion compensator 91 and causing the distortion compensator 91 to operate. On the other hand, if the average power level is low or if the average power level is high and the peak-to-average power ratio is small, the radio communication circuit illustrated in FIGS. 5 to 7 or the radio communication device illustrated in FIG. 3 may stop the supply of power to the distortion compensator 91 and cause the distortion compensator 91 to stop operating. Thus, the amount of power to be consumed may be reduced, compared with the case where if the average power level is high, power is supplied to the distortion compensator 91 and causes the distortion compensator 91 to operate.

In addition, the radio communication circuit illustrated in FIGS. 5 and 7 calculates the peak-to-average power ratio based on the I and Q baseband signals and may thus easily obtain the peak-to-average power ratio. In addition, the radio communication circuit illustrated in FIGS. 5 and 7 controls the power source of the distortion compensator 91 based on the result of the comparison of the instantaneous amplitude of the signals to be transmitted with the threshold so as to turn on or off the power source of the distortion compensator 91 and may thus easily control the power source of the distortion compensator 91 so as to turn on or off the power source of the distortion compensator 91. In addition, the radio communication circuit illustrated in FIGS. 5 and 7 obtains the average power level based on the information used to control the gain of the TX-VGA 103 and may thus easily obtain the average power level.

Third Example of Radio Communication Circuit

Figure 9:
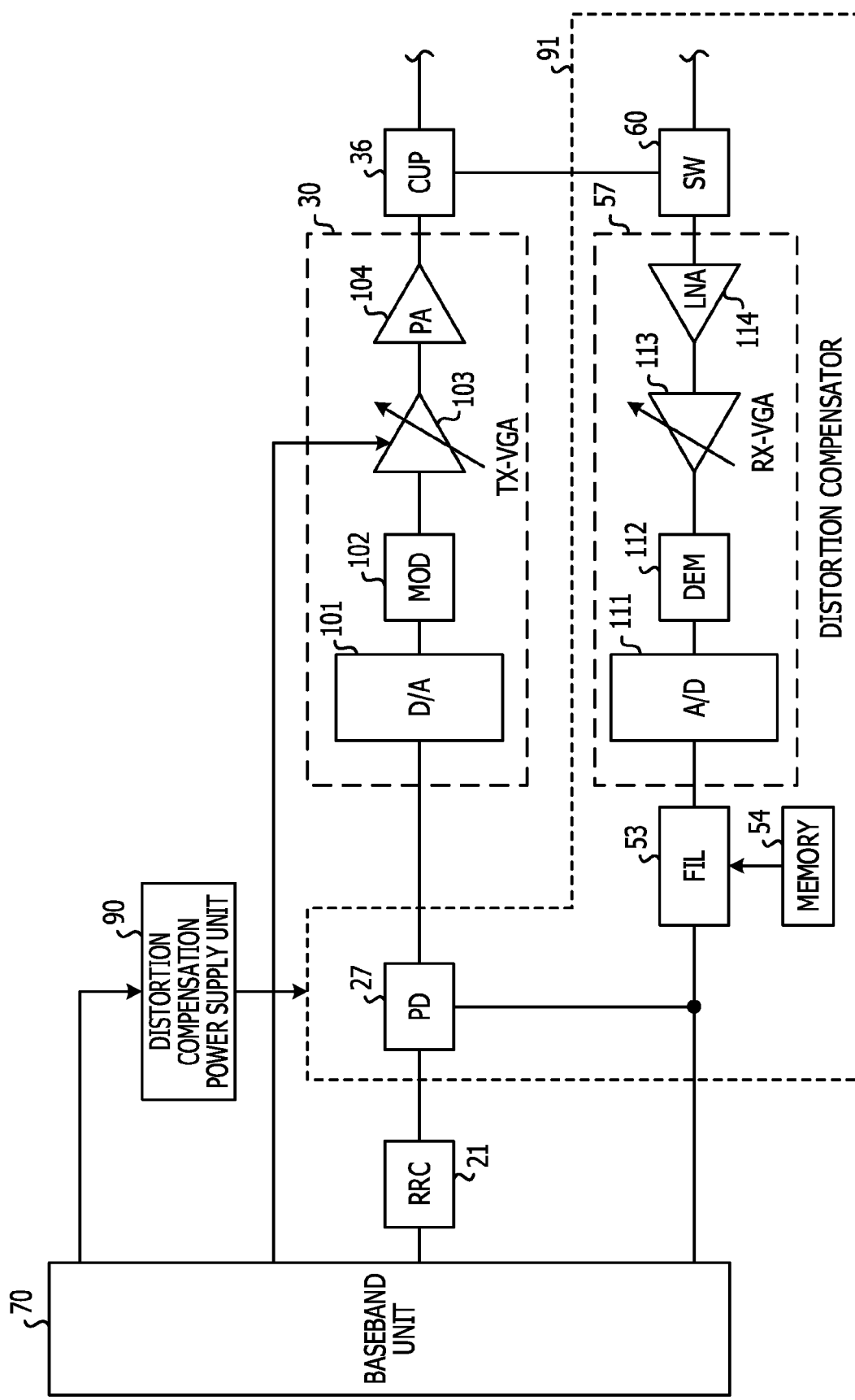
FIG. 9 is a diagram illustrating a third example of the radio communication circuit that achieves the distortion compensation function of the radio communication device illustrated in FIG. 3.
Figure 10:
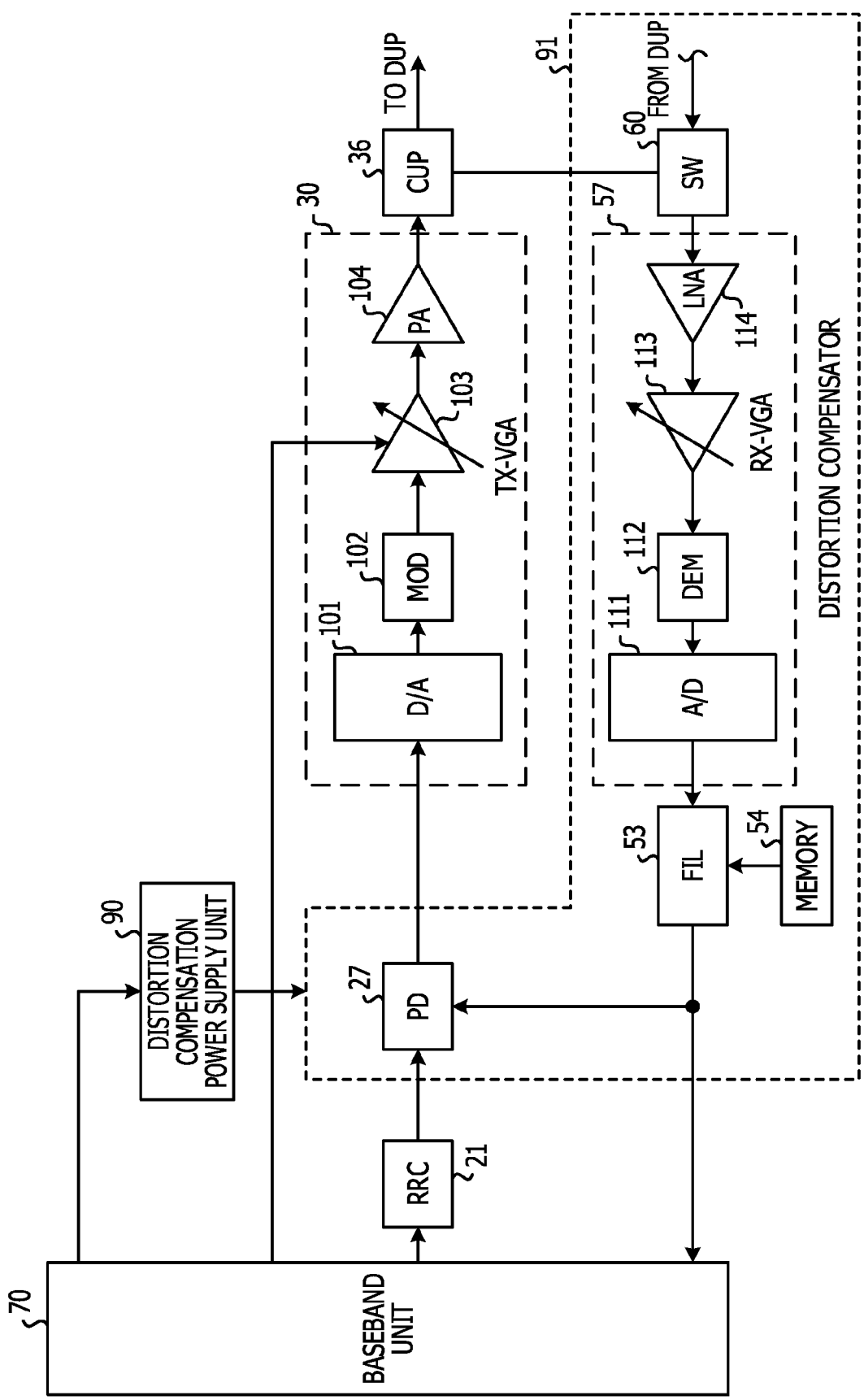
FIG. 10 is a diagram illustrating the flows of signals in the radio communication circuit illustrated in FIG. 9.

FIG. 9 is a diagram illustrating a third example of the radio communication circuit that achieves the distortion compensation function of the radio communication device illustrated in FIG. 3. FIG. 10 is a diagram illustrating the flows of signals in the radio communication circuit illustrated in FIG. 9.

As illustrated in FIGS. 9 and 10, in the third example of the radio communication circuit, I and Q baseband signals output from the RRC 21 are not input to the baseband unit 70. Other configurations in the third example of the radio communication circuit are the same as the second example of the radio communication circuit illustrated in FIGS. 5 and 6. Thus, a duplicated description is omitted.

Figure 11:
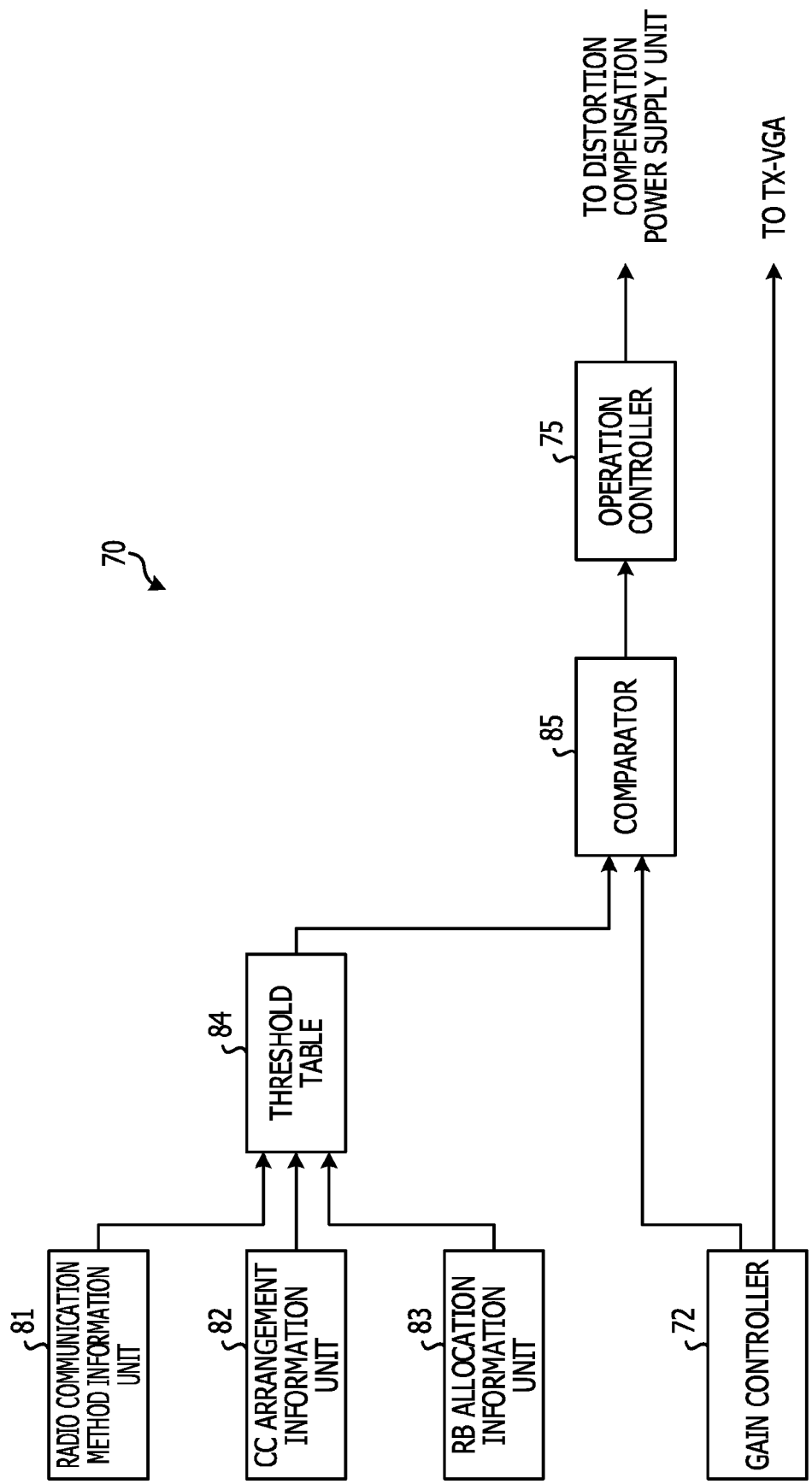
FIG. 11 is a diagram illustrating functional units achieved by a baseband unit included in the radio communication circuit illustrated in FIG. 9.

FIG. 11 is a diagram illustrating functional units achieved by the baseband unit included in the radio communication circuit illustrated in FIG. 9. As illustrated in FIG. 11, the functional units, a radio communication method information unit 81, a CC arrangement information unit 82, an RB allocation information unit 83, a threshold table 84, a gain controller 72, a comparator 85, and an operation controller 75 are achieved by the baseband unit 70. The functional units 72, 75, and 81 to 85 may be achieved by hardware or by causing a processor to execute software.

The radio communication method information unit 81 outputs information that represents a radio communication method for a signal to be transmitted from the radio unit 20 of the first modulation scheme. For example, if the radio communication method to be used by the radio unit 20 of the first modulation scheme is W-CDMA, the radio communication method information unit 81 outputs a value that corresponds to W-CDMA.

The CC arrangement information unit 82 outputs component carrier arrangement information of the signal to be transmitted from the radio unit 20 of the first modulation scheme. In LTE-Advanced, carrier aggregation (CA) for executing communication using multiple LTE carrier signals (component carriers (CCs)) simultaneously is introduced. The component carrier arrangement information represents an arrangement of multiple carriers to be simultaneously used. The CA is described in NTT DOCOMO Technical Journal, vol. 18, No. 2, "Carrier Aggregation Achieving Increase in Bandwidth for LTE-Advanced" (http://www.nttdocomo.co.jp/corporate/technology/rd/technical_journal/bn/vol18_2/, searched on Jul. 28, 2013).

The RB allocation information unit 83 outputs information that represents an allocation of resource blocks (RBs) of the signal to be transmitted from the radio unit 20 of the first modulation scheme. For example, in a method that is called Clustered Discrete Fourier Transform Spread-Orthogonal Frequency Division Multiplexing (Clustered DFTS-OFDM), the resource blocks to be used for transmission in a single CC may be discretely allocated on a frequency axis.

The threshold table 84 stores thresholds corresponding to the radio communication methods, allocations of resource blocks, arrangements of multiple carriers to be simultaneously used, or combinations thereof. Information representing a radio communication method, information representing an allocation of a resource block, information representing an arrangement of multiple carriers to be simultaneously used, or information of a combination thereof is provided to the threshold table 84 from the radio communication method information unit 81, the CC arrangement information unit 82, or the RB allocation information unit 83. A threshold that corresponds to the information provided to the threshold table 84 is output from the threshold table 84. FIG. 12 illustrates an example of the threshold table 84.

FIG. 12 is a diagram illustrating the example of the threshold table included in the baseband unit 70 illustrated in FIG. 11. In the example illustrated in FIG. 12, the threshold table 84 stores thresholds for transmitter power output for the radio communication methods for large, medium, and small peak-to-average power ratios. In the case of LTE, the threshold table 84 stores thresholds for transmitter power output for each of allocations of RBs. In the case of LTE-Advanced, the threshold table 84 stores thresholds for transmitter power output for each of allocations of RBs for each of CCs.

The peak-to-average power ratio varies depending on a radio communication method, an allocation of a resource block, an arrangement of multiple carriers to be simultaneously used, or a combination thereof. Thus, the peak-to-average power ratio is calculated before the generation of the threshold table 84, while the radio communication method, the allocation of the resource block, the arrangement of the multiple carriers to be simultaneously used, or the combination thereof is changed. Then, the threshold table 84 is generated based on the peak-to-average power ratio calculated.

As illustrated in the example of FIG. 12, the thresholds may be set so as to ensure that as the peak-to-average power ratio increases, thresholds are reduced. For example, in the case of LTE, when the number of RBs to be allocated is "1", a threshold when the peak-to-average power ratio is "small" is "+24 dBm", a threshold when the peak-to-average power ratio is "medium" is "+23 dBm", and a threshold when the peak-to-average power ratio is "large" is "+22 dBm".

For example, in the case of LTE-Advanced, when a CC to be allocated is "20 MHz" and the number of RBs to be allocated is "1", a threshold when the peak-to-average power ratio is "small" is "+23 dBm", a threshold when the peak-to-average power ratio is "medium" is "+22 dBm", and a threshold when the peak-to-average power ratio is "large" is "+21 dBm". In the example illustrated in FIG. 12, in the case of W-CDMA, a threshold is "+17 dBm" regardless of whether the peak-to-average power ratio is "large", "medium", or "small".

Values within the threshold table 84 illustrated in FIG. 12 are an example, and values within the threshold table 84 are not limited to the values illustrated in FIG. 12. In the case of W-CDMA, the threshold may vary depending on the peak-to-average power ratio. Values of the peak-to-average power ratio are not limited to the three levels, "large", "medium", and "small" values and may be two levels, "large" and "small" values or may be four or more levels.

The gain controller 72 obtains the average power level as described in the second example of the radio communication circuit. Thus, a duplicated description is omitted.

A threshold output from the threshold table 84, and the information stored in the gain controller 72 and representing the average power level, are provided to the comparator 85. The comparator 85 compares the threshold output from the threshold table 84 with the average power level stored in the gain controller 72. Specifically, if the average power level is equal to or higher than the threshold, the comparator 85 may return "true". If the average power level is lower than the threshold, the comparator 85 may return "false".

As described in the second example of the radio communication circuit, the comparator 85 may acquire the information of the average power level from the reception gain controller (not illustrated) or may obtain the information of the average power level from the average power level monitored based on the voltage detected by the diode detection.

As described in the second example of the radio communication circuit, the operation controller 75 outputs, to the distortion compensation power supply unit 90, the control signals that cause the power source of the distortion compensator 91 to be turned on and off. Thus, a duplicated description is omitted.

The radio communication method information unit 81, the CC arrangement information unit 82, the RB allocation information unit 83, the threshold table 84, the comparator 85, the gain controller 72, the operation controller 75, and the distortion compensation power supply unit 90 are an example of the power controller. The distortion compensation power supply unit 90 may be one of functional units achieved by the baseband unit 70.

Figure 13:
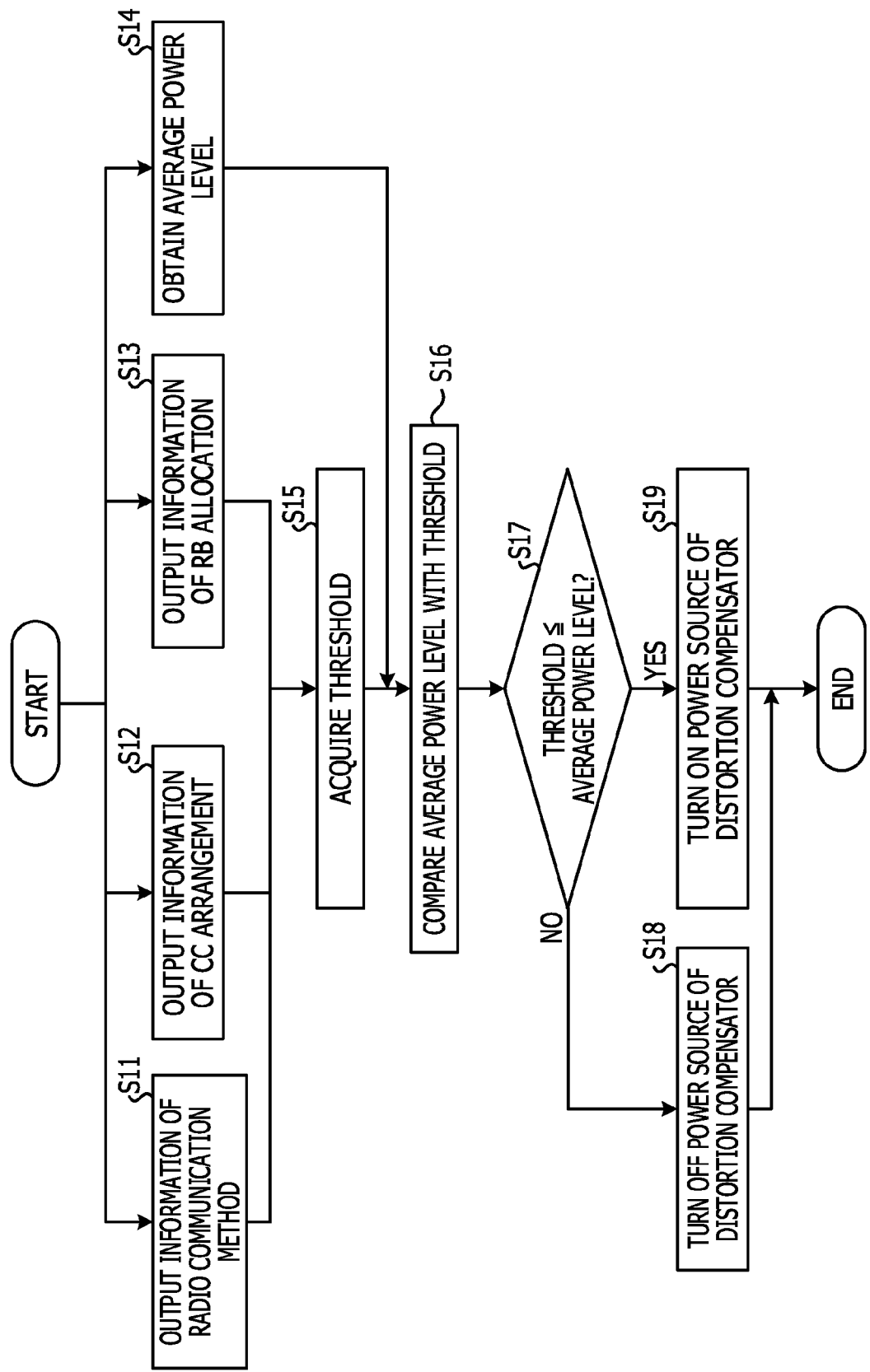
FIG. 13 is a flowchart of operations to be executed by the radio communication circuit illustrated in FIGS. 9 to 12.

FIG. 13 is a flowchart of operations to be executed by the radio communication circuit illustrated in FIGS. 9 to 12. As illustrated in FIG. 13, when the radio communication circuit starts an operation of transmitting a signal, the radio communication method information unit 81 outputs information that represents a radio communication method (in step S11). In addition, the CC arrangement information unit 82 outputs information that represents an arrangement of multiple carriers (in step S12). Furthermore, the RB allocation information unit 83 outputs information that represents an allocation of a resource block (in step S13). Furthermore, the gain controller 72 monitors a power level of the signal to be transmitted and obtains an average power level (in step S14).

If the radio communication method is W-CDMA, the CC arrangement information unit 82 and the RB allocation information unit 83 may output "null". If the radio communication method is LTE, the RB allocation information unit 83 may output "null". The operations of steps S11, S12, S13, and S14 may be executed in parallel by the radio communication method information unit 81, the CC arrangement information unit 82, the RB allocation information unit 83, and the gain controller 72.

Then, the comparator 85 acquires, from the threshold table 84, a threshold that corresponds to the information output in steps S11 to S13 (in step S15). The comparator 85 compares the average power level obtained in step S14 with the threshold acquired in step S15 (in step S16).

If the average power level is lower than the threshold as a result of the comparison (No in step S17), the operation controller 75 outputs, to the distortion compensation power supply unit 90, the control signal that causes the power source of the distortion compensator 91 to be turned off. Then, the distortion compensator 90 controls the power source of the distortion compensator 91 so as to turn off the power source of the distortion compensator 91. Thus, the power source of the distortion compensator 91 is turned off (in step S18).

If the average power level is equal to or higher than the threshold (Yes in step S17), the operation controller 75 outputs, to the distortion compensation power supply unit 90, the control signal that causes the power source of the distortion compensator 91 to be turned on. Then, the distortion compensator 90 controls the power source of the distortion compensator 91 so as to turn on the power source of the distortion compensator 91. Thus, the power source of the distortion compensator 91 is turned on (in step S19).

During the transmission of a signal by the radio communication circuit, the radio communication circuit repeats the aforementioned steps S11 to S19. When the signal transmission is terminated, the radio communication circuit terminates a series of the operations.

Since the radio communication circuit illustrated in FIG. 9 and described with reference to FIGS. 11 to 13 controls the supply of power to the distortion compensator 91 based on the average power level and the peak-to-average power ratio and stops the supply of the power based on the average power level and the peak-to-average power ratio, the amount of power to be consumed may be reduced.

In addition, since the radio communication circuit illustrated in FIG. 9 and described with reference to FIGS. 11 to 13 has the threshold table 84 storing the thresholds corresponding to the radio communication methods, the arrangements of the multiple carriers, and the allocations of the resource blocks, a threshold that corresponds to a radio communication method, an arrangement of multiple carriers, and an allocation of a resource block may be acquired. Thus, the peak-to-average power ratio is not calculated for each case, and power to be used in order to calculate the peak-to-average power ratio may be reduced.

In addition, the radio communication circuit illustrated in FIG. 9 and described with reference to FIGS. 11 to 13 has the threshold table 84 storing the thresholds set so as to ensure that as the peak-to-average power ratio increases, the thresholds are reduced. Thus, even in a case where as the peak-to-average power level increases, the average power level is reduced, the average power level is equal to or higher than the threshold. On the other hand, in a case where even if the peak-to-average power ratio is reduced, the average power level does not increase, the average power level is lower than the threshold. Specifically, if the peak-to-average power ratio is small and the average power level is high, the supply of power to the power source of the distortion compensator 91 may be stopped and the distortion compensator 91 may be stopped operating. Thus, the amount of power to be consumed may be reduced, compared with a case where if the average power level is high, power is supplied to the power source of the distortion compensator 91 and thereby causes the distortion compensator 91 to operate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A radio communication circuit comprising:
a transmitter that includes a modulator configured to modulate a signal with a first modulation scheme and a power amplifier configured to amplify the signal modulated with the first modulation scheme and output the signal amplified and is configured to transmit the signal amplified by the power amplifier;
a receiver that includes a demodulator configured to demodulate the signal output from the transmitter with a second modulation scheme that is different from the first modulation scheme;
a pre-distortion compensator configured to compensate for a distortion, occurred upon the amplification of the signal by the power amplifier, of the signal input to the transmitter, based on the signal demodulated by the demodulator; and
a power controller configured to control supply of power to the receiver and the pre-distortion compensator and stop the supply of the power based on an average power level of the signal output from the transmitter and a peak-to-average power ratio that is a ratio of an instantaneous peak power level to the average power level.

2. The radio communication circuit according to claim 1, wherein the power controller calculates the peak-to-average power ratio based on a baseband signal before the modulation by the modulator.

3. The radio communication circuit according to claim 1, wherein the power controller calculates, based on the average power level and the peak-to-average power ratio, an instantaneous amplitude of the signal output from the power amplifier,
wherein when the peak-to-average power ratio calculated is equal to or larger than a preset threshold, the power controller supplies the power, and
wherein when the peak-to-average power ratio calculated is smaller than a preset threshold, the power controller stops the supply of the power.

4. The radio communication circuit according to claim 1, wherein the power controller has a table storing thresholds corresponding to radio communication methods, allocations of resource blocks, arrangements of multiple carriers to be simultaneously used, or combinations thereof, and acquires a threshold from the table based on radio communication method information representing a radio communication method to be used for the signal output from the transmitter, resource block allocation information representing an allocation of a resource block, or component carrier arrangement information representing an arrangement of multiple carriers to be simultaneously used,
wherein when the average power level is equal to or higher than the threshold acquired from the table, the power controller supplies the power, and
wherein when the average power level is lower than the threshold acquired from the table, the power controller stops the supply of the power.

5. The radio communication circuit according to claim 4, wherein the threshold is set so as to ensure that as the peak-to-average power ratio increases, the threshold is reduced.

6. The radio communication circuit according to claim 1, wherein the transmitter includes a variable gain amplifier configured to amplify a power level of the signal to be output from the transmitter so as to cause the signal to have a predetermined power level, and
wherein the power controller obtains the average power level from information that controls a gain of the variable gain amplifier.

7. A radio communication device comprising
a radio communication circuit that includes:
a transmitter that includes a modulator configured to modulate a signal with a first modulation scheme and a power amplifier configured to amplify the signal modulated with the first modulation scheme and output the signal amplified and is configured to transmit the signal amplified by the power amplifier;
a receiver that includes a demodulator configured to demodulate the signal output from the transmitter with a second modulation scheme that is different from the first modulation scheme, a pre-distortion compensator configured to compensate for a distortion, occurred upon the amplification of the signal by the power amplifier, of the signal input to the transmitter, based on the signal demodulated by the demodulator, and a power controller configured to control supply of power to the receiver and the pre-distortion compensator and stop the supply of the power based on an average power level of the signal output from the transmitter and a peak-to-average power ratio that is a ratio of an instantaneous peak power level to the average power level; and a power supplier that supply the power to the receiver and the pre-distortion compensator.

* * * * *